(12) United States Patent
Ditewig et al.

(10) Patent No.: US 7,986,548 B2
(45) Date of Patent: Jul. 26, 2011

(54) CURRENT RE-ROUTING SCHEME FOR SERIAL-PROGRAMMED MRAM

(75) Inventors: Anthonie Meindert Herman Ditewig, Eindhoven (NL); Roger Cuppens, Eindhoven (NL)

(73) Assignee: NXP B.V., Eindhoven (NL)

( * ) Notice: Subject to any disclaimer, the term of this patent is extended or adjusted under 35 U.S.C. 154(b) by 1135 days.

(21) Appl. No.: 10/536,271

(22) PCT Filed: Oct. 29, 2003

(86) PCT No.: PCT/IB03/04868
§ 371 (c)(1),
(2), (4) Date: May 24, 2005

(87) PCT Pub. No.: WO2004/049342
PCT Pub. Date: Jun. 10, 2004

(65) Prior Publication Data
US 2006/0023489 A1 Feb. 2, 2006

(30) Foreign Application Priority Data

Nov. 27, 2002 (EP) .................................... 02079956

(51) Int. Cl.
*G11C 11/00* (2006.01)
(52) U.S. Cl. ..................... 365/158; 365/171; 365/173
(58) Field of Classification Search .................. 365/158, 365/171, 173
See application file for complete search history.

(56) References Cited

U.S. PATENT DOCUMENTS 6,490,190 B1 * 12/2002 Ramcke et al. ............... 365/158
6,614,682 B2 * 9/2003 Hirai ............................. 365/173

* cited by examiner

*Primary Examiner* — Pho M Luu

(57) ABSTRACT

The present invention provides a method and device for programming a magnetic random access memory element with reduced current consumption, by re-routing digitline current through a selected bitline in a selected direction.

15 Claims, 4 Drawing Sheets

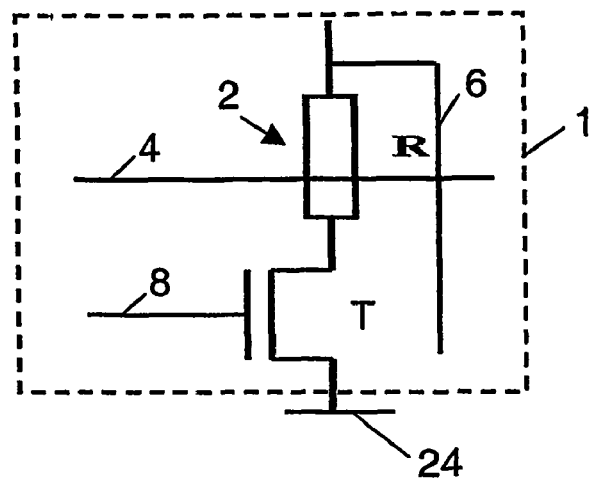
Fig. 1 - Prior art
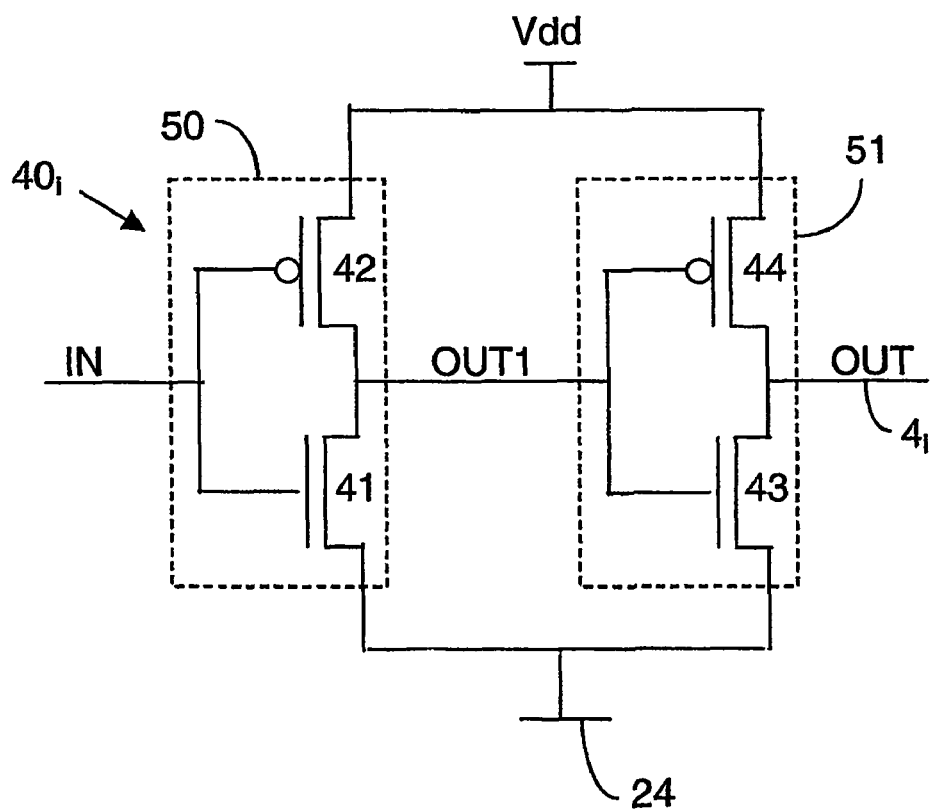
Fig. 4

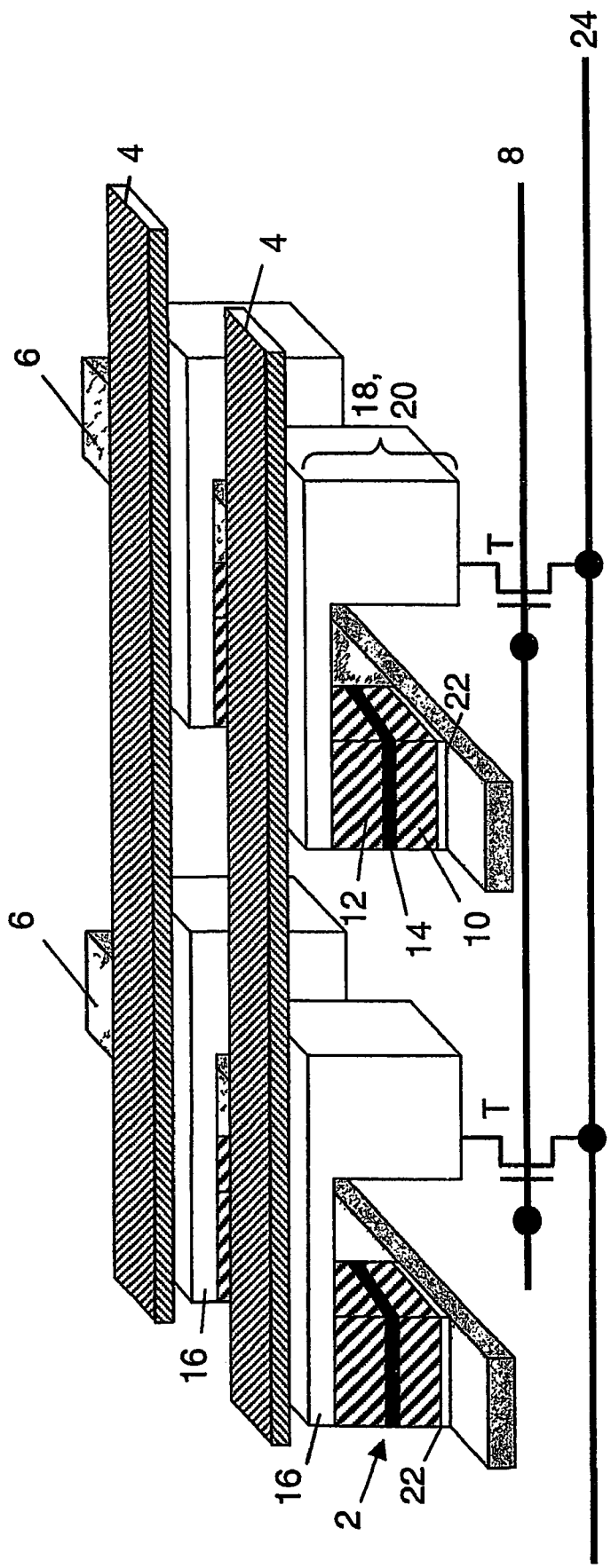
Fig. 2 - Prior art

CURRENT RE-ROUTING SCHEME FOR SERIAL-PROGRAMMED MRAM

The present invention relates to magnetic or magnetoresistive random access memories (MRAMs), and more particularly to a method and apparatus for saving current consumption when programming such memories.

Magnetic or Magnetoresistive Random Access Memory (MRAM) is currently being considered by many companies as a successor to flash memory. It has the potential to replace all but the fastest static RAM (SRAM) memories. It is a non-volatile memory device, which means that no power is required to sustain the stored information. This is seen as an advantage over most other types of memory.

The MRAM concept was originally developed at Honeywell Corp. USA, and uses magnetization direction in a magnetic multilayer device as information storage and the resultant resistance difference for information readout. As with all memory devices, each cell in an MRAM array must be able to store at least two states which represent either a "1" or a "0".

Different kinds of magnetoresistive (MR) effects exist, of which the Giant Magneto-Resistance (GMR) and Tunnel Magneto-Resistance (TMR) are currently the most important ones. The GMR effect and the TMR or Magnetic Tunnel Junction (MTJ) or Spin Dependent Tunneling (SDT) effect provide possibilities to realize a.o. non-volatile magnetic memories. These devices comprise a stack of thin films of which at least two are ferromagnetic or ferromagnetic, and which are separated by a non-magnetic interlayer. GMR is the magneto-resistance for structures with conductor interlayers and TMR is the magneto-resistance for structures with dielectric interlayers. If a very thin conductor is placed between two ferromagnetic or ferromagnetic films, then the effective in-plane resistance of the composite multilayer structure is smallest when the magnetization directions of the films are parallel and largest when the magnetization directions of the films are anti-parallel. If a thin dielectric interlayer is placed between two ferromagnetic or ferromagnetic films, tunneling current between the films is observed to be the largest (or thus resistance to be the smallest) when the magnetization directions of the films are parallel and tunneling current between the films is the smallest (or thus resistance the largest) when the magnetization directions of the films are anti-parallel.

Magneto-resistance is usually measured as the percentage increase in resistance of the above structures going from parallel to anti-parallel magnetization states. TMR devices provide higher percentage magneto-resistance than GMR structures, and thus have the potential for higher signals and higher speed. Recent results indicate tunneling giving over 40% magneto-resistance, compared to 6-9% magneto-resistance in good GMR cells.

An MRAM comprises a plurality of magnetoresistive memory units 1 arranged in an array. One such prior art memory unit 1 is shown in FIG. 1. Each memory unit 1 comprises a magnetoresistive memory element 2, a first intersection of a digit line 4 and a bit line 6, and a second intersection of the bit line 6 and a word line 8. The memory units 1 are coupled in series in columns by means of the bit lines 6 and coupled in series in rows by means of the digit lines 4 and word lines 8, thus forming the array. The magnetoresistive memory elements 2 used may for example, but not limited thereto, be magnetic tunnel junctions (MTJs).

MTJ memory elements 2 generally include a non-magnetic conductor forming a lower electrical contact 22, a pinned magnetic layer 10, a dielectric barrier layer 14 positioned on the pinned layer 10, and a free magnetic layer 12 positioned on the dielectric barrier layer 14, with an upper contact 16 on the free magnetic layer 12. The pinned magnetic layer 10 and the free magnetic layer 12 may both be composed of e.g. NiFe, and the dielectric barrier layer 14 may e.g. be made of AlOx.

The pinned layer 10 of magnetic material has a magnetic vector that always points in the same direction. The magnetic vector of the free layer 12 is free, but constrained by the physical size of the layer, to point in either of two directions: parallel or anti-parallel with the magnetization direction of the pinned layer 10.

An MTJ memory element 2 is used by connecting it in a circuit such that electricity can flow vertically through the element 2 from one of the magnetic layers to the other. The MTJ unit 1 can be electrically represented by a resistor R in series with a switching element such as a transistor T, as shown in FIG. 1. The size of the resistance of the resistor R depends on the orientation of the magnetic vectors of the free and pinned magnetic layers of the memory element 2. The MTJ element 2 has a relatively high resistance (HiRes) when the magnetic vectors point in opposite directions, and it has a relatively low resistance (LoRes) when the magnetic vectors point in the same direction.

A diagrammatic elevational view of a 2×2 array of prior art memory units is shown in FIG. 2. In an MRAM array, comprising a plurality of MRAM units, orthogonal conductive lines 4, 6 pass under and over each bit or memory element 2, carrying current that produces a switching field. Each bit is designed so that it will not switch when current is applied to just one line, but will switch when current is flowing through both lines that cross at the selected bit (switching will occur only if the magnetic vector of the free layer is not in accordance with the direction of the switching field).

Digit lines 4 and bit lines 6 are provided in an array of MTJ memory units 1, where the digit lines 4 travel along the rows of the array on one side of the memory elements 2, and the bit lines 6 travel down the columns of the array on the opposite side of the memory elements 2. The structure in FIG. 2 is partially inverted for clarity purposes: digit lines 4 physically run underneath the MTJ elements 2 (at that side of the MTJ elements 2 oriented towards the substrate in which the transistor T is provided), and bit lines 6 physically run over the MTJ elements 2 (at that side of the MTJ elements 2 oriented away from the substrate in which the transistor T is provided). However, if drawn that way, the bit lines 6 would obscure the magnetoresistive elements 2, which are the more relevant parts of the drawing.

Each memory element 2 is a layered structure comprising a fixed or pinned layer 10, a free layer 12 and a dielectric barrier 14 in between. By applying a small voltage over the sandwich of ferromagnetic or ferromagnetic layers 10, 12 with the dielectric 14 therebetween, electrons can tunnel through the dielectric barrier 14.

The memory element 2 is connected to the transistor T by means of an interconnect layer 16 and a plurality of metalization layers 18 and vias 20. There is a galvanic connection 22 between the memory element 2 and the bit line 6. The transistor T of each memory unit 1 is connected to a ground line 24.

In write or program mode, required currents flow through selected digit lines 4 and bit lines 6 so that at their intersection a peak magnetic field is generated, sufficient to switch the polarization of the free layer 12 of the MTJ element 2, so as to switch the resistance of the MTJ unit 2 from the LoRes (low resistance) state to the HiRes (high resistance) state or vice versa (depending on the direction of the current through the bit line 6). At the same time, the switching element such as transistor T in the selected memory unit 1 (the memory unit at the intersection of the selected digit line 4 and the selected bit line 6) is in the cut-off state, for example by keeping the voltage on the word line 8 low (0 volt in case the switching element is a transistor T). The currents in the selected digit line 4 and the selected bit line 6 are such that together they provide a magnetic field able to change the direction of the magnetic vector of the free layer of the selected memory element but the current in either strip by itself is not able to change the storage state. Therefore only the selected memory element is written, not any of the other memory elements on the same selected digit line 4 or bit line 6.

A disadvantage with MRAM is that the programming current needed is very high, because of the requirement of two high enough magnetic fields being induced in the neighborhood of the magnetoresistive material.

For writing or programming a typical MRAM, for example a bitline current of 3 mA and a digitline current of 4 mA is needed. The values given are examples only and can be different. When an MRAM with a word size of 16 bit is designed, this leads to a current dissipation of 16*3+4=52 mA for writing one word. For a lot of applications, and especially for on-board memories which are powered by batteries this current dissipation is too much.

Since MRAM programming times are much faster than FLASH (for example MRAM programs in 30 ns while Fowler-Nordheim programmed FLASH needs a time in the millisecond range), some of the programming speed of MRAM can be traded off to achieve lower programming current, as explained hereinafter. If the MRAM is not written in parallel, so not all 16 bits are written at the same time, but they are written in series, one at a time, the programming time becomes longer (16*30 ns=0.48 μs, which is still much faster than FLASH) but the programming current becomes significantly lower: it reduces to 3+4=7 mA.

It is an object of the present invention to reduce current consumption still more when serially programming bits of an MRAM.

The above objective is accomplished by a method and device according to the present invention.

The present invention provides a method for programming a magnetoresistive memory element or magnetic random access memory element with reduced current consumption. The method comprises providing current through a first and a second conductive strip, which first and second strips cross each other at the memory element, wherein the current through the first conductive strip is temporarily routed through the second conductive strip. This way, two magnetic fields with different directions are generated at the memory element. As the currents which generate these magnetic fields are shared, total power consumption can be reduced.

The present invention also provides a magnetic random access memory unit, comprising:

a magnetic random access memory element or magnetoresistive memory element comprising a first magnetic layer and a second magnetic layer separated by a non-magnetic layer, a first conductive strip being magnetically couplable to the first magnetic layer and a second conductive strip being magnetically couplable to the second magnetic layer, the first and second conductive strips being arranged so as to cross each other at the memory element, and connecting means for temporarily electrically connecting the first conductive strip to the second conductive strip.

The connecting means may furthermore comprise current direction switching means for switching the direction of the current through the second conductive strip. These current direction switching means are switched in either one of two states, depending on the data to be written in the memory element, each state corresponding to a different direction in which the current flows through the second conductive strip, and thus to a different direction of a magnetic field generated by that current. A control unit may be provided for controlling the switching of the current direction switching means, in function of the data to be written in the memory element;

The connecting means may comprise at least one switch. The switch may be formed by a semiconductor device such as a transistor. A control unit may be provided for providing suitable signals for controlling the at least one switch, so as to connect a given first conductive strip to a given second conductive strip.

The first conductive strip may be provided with a line driver. The line driver may be a tristate-driver.

The magnetoresistive element may comprise a magnetic tunnel junction (MTJ).

The present invention furthermore provides a matrix with magnetoresistive memory units arranged in logically organized rows and columns, each memory unit including a magnetoresistive element, such as an MTJ for example, the matrix being provided with at least one first conductive strip and with at least one second conductive strip, all memory units on a row being magnetically couplable to one of the at least one first conductive strips and all memory units on a column being magnetically couplable to one of the at least one second conductive strips, wherein the matrix comprises connecting means for temporarily electrically connecting one of the at least one first conductive strips to one of the at least one second conductive strips.

The matrix may be provided with a plurality of first conductive strips and/or a plurality of second conductive strips. The number of first conductive strips may be the same as the number of second conductive strips, or both numbers may be different. Only a limited number of first and second conductive strips is described in the illustrative embodiments, but the matrix may be of any size.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

FIG. 1 is an electrical representation of an MRAM unit for connection in an array according to the prior art.

FIG. 2 is a diagrammatic elevational view of a 2×2 array of MTJ units according to the prior art.

FIG. 4 is a circuit diagram or a digitline driver that may be used in the re-routing scheme of FIG. 3.

Figure 3:
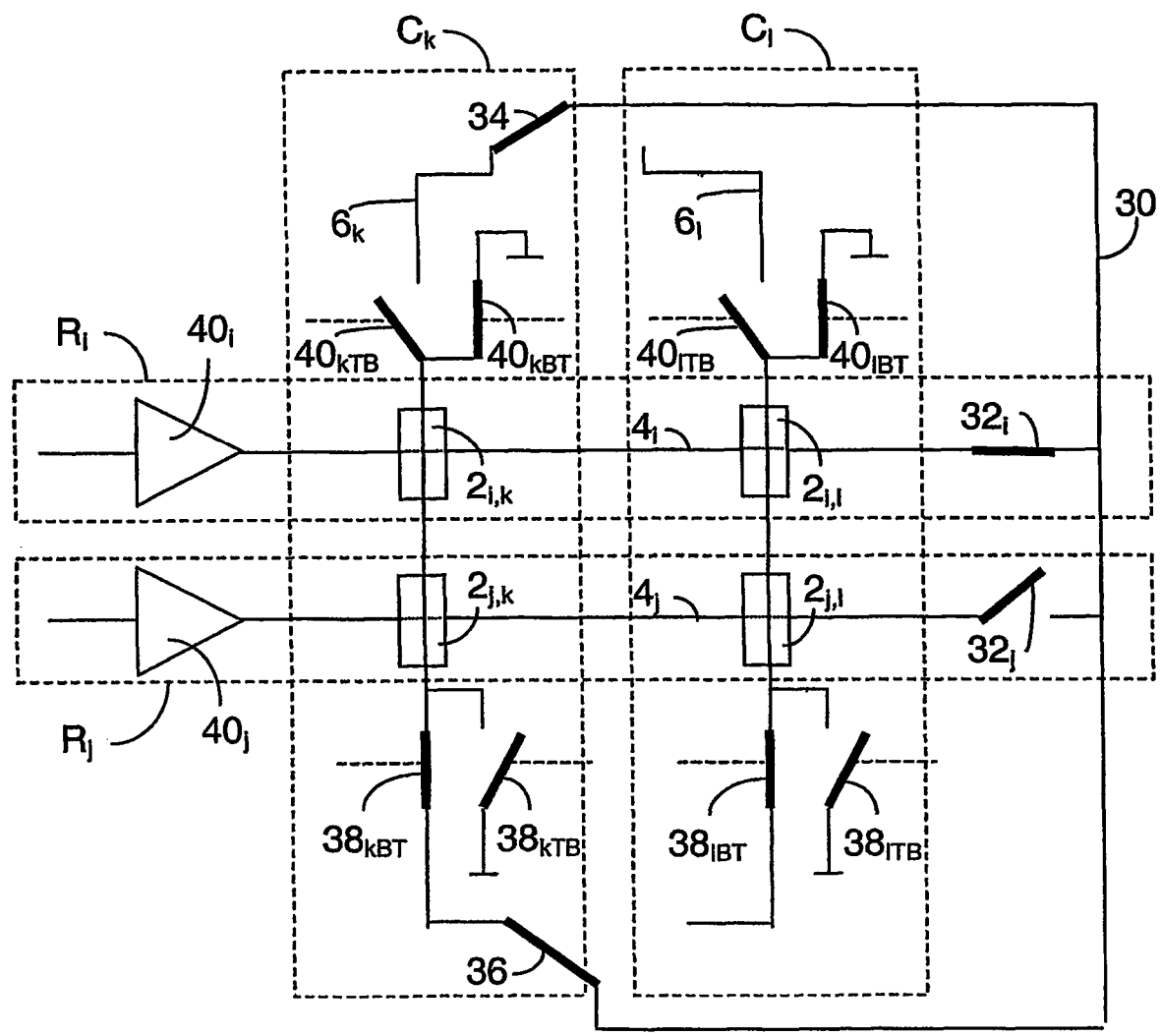
FIG. 3 is a symbol circuit diagram of a current re-routing scheme according to an embodiment of the present invention.

In the different figures, the same reference figures refer to the same or analogous elements.

The present invention will be described with respect to particular embodiments and with reference to certain drawings but the invention is not limited thereto but only by the claims. The drawings described are only schematic and are non-limiting. In the drawings, the size of some of the elements may be exaggerates and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

A general scheme of a circuit for re-routing current from a digitline to a bitline in an MRAM memory is given in FIG. 3.

As already mentioned, an MRAM memory element can be written or programmed by two magnetic fields. These magnetic fields are induced by currents, more specifically by a current through a bitline and a current through a digitline, which bitline and digitline cross each other at the memory element. If the currents which induce these magnetic fields can be shared, a reduction of the total current consumption can be achieved.

According to the present invention, the digitline current is redirected to the selected bitline so that only the digitline current needs to be generated. This saves the current consumption to 4 mA in a typical mRAM.

FIG. 3 shows only part of an n by m matrix of memory elements $2$. The complete matrix comprises memory elements $2$ organized in n rows $R_l, \ldots, R_i, \ldots, R_j, \ldots, R_n$, and in m columns $C_l, \ldots, C_k, \ldots, C_l, \ldots, C_m$. Only the rows $R_i$ and $R_j$, and the columns $C_k$ and $C_l$ have been represented in FIG. 3. A digitline $4$ is provided for each row R, and is magnetically couplable to the memory elements $2$ of that row R. In particular in FIG. 3 only digitlines $4_i$ and $4_j$ are shown. A bitline $6$ is provided for each column C, and is magnetically couplable to the memory elements $2$ of that column C. In particular in FIG. 3 only bitlines $6_k$ and $6_l$ are shown. Only the memory elements $2_{i,k}, 2_{i,l}, 2_{j,k}$ and $2_{j,l}$ at the cross-points of the respective digitlines $4_i, 4_j$ and bitlines $6_k, 6_l$ are shown in FIG. 3.

The operation of the circuit is as follows.

When for example memory element $2_{i,k}$ needs to be programmed, digitline $4_i$ of row $R_i$ and bitline $6_k$ of column $C_k$ need to be selected. According to the present invention bitline $6_k$ needs to be connected to digitline $4_i$ so as to enable to re-route current from digitline $4_i$ through bitline $6_k$. Accordingly, connecting means are provided, such as e.g. a connecting branch $30$ provided with a set of connecting switching elements such as switches $32_i, 32_j$ between the branch $30$ and the digitlines $4_l, \ldots, 4_i, \ldots, 4_j, \ldots, 4_n$ and with a set of bitline selection switching elements such as switches $34, 36$, between the branch $30$ and the bitlines $6_l, \ldots, 6_k, \ldots, 6_l, \ldots, 6_m$. If memory element $2i,k$ needs to be programmed, the connecting switching element $32_i$ between digitline $4_i$ and branch $30$ and at least one of the bitline selection switching elements $34, 36$ between bitline $6_k$ and branch $30$ need to be in the ON-state (connecting state), depending on the data that needs to be written in the memory element $2_{i,k}$, as represented in FIG. 3. Depending on the data that needs to be written in the memory element $2_{i,k}$ the current must flow through the bitline $6$, in either of two directions (bottom to top or top to bottom in FIG. 3).

As an example it is assumed that the current needs to flow from bottom to top. In that case, current direction switching elements such as switches $38_{kBT}$ and $40_{kBT}$ need to be in the ON-state (physical connection between the wires), while current direction switching elements such as switches $38_{kTB}$ and $40_{kTB}$ are in the OFF-state (no physical connection between the wires so that current cannot flow through). This situation is represented in FIG. 3.

When a current is now flowing from digitline driver $40_i$ through digitline $4_i$, under the memory element $2_{i,k}$, through the connecting switching element $32_i$, it is also flowing through the bitline selection switching element $36$, through the current direction switching element $38_{kBT}$, over the memory element $2_{i,k}$, through current direction switching element $40_{kBT}$ to ground.

When the current needs to be reversed, i.e. it needs to flow from top to bottom through the bitline $6_k$, in order to write data with the inverse value ("1" instead of "0" or vice versa), again connecting switching element $32_i$ is in the ON-state, while the other connecting switching elements are in the OFF-state. Bitline selection switching element $34$ is in the ON-state so as to connect branch $30$ to the top of bitline $6_k$. Current direction switching elements $38_{kBT}$ and $40_{kBT}$ are in the OFF-state, while current direction switching elements $38_{kTB}$ and $40_{kTB}$ are in the ON-state.

Now the current flows from digitline driver $40_i$ through digitline $4_i$, under the memory element $2_{i,k}$, through the connecting switching element $32_i$, through branch $30$, through the bitline selection switching element $34$, through the current direction switching element $40_{kTB}$, over the memory element $2_{i,k}$, through current direction switching element $38_{kTB}$ to ground.

As explained above, a current through a selected digitline is re-routed to a selected bitline in a selected direction (top to bottom or bottom to top). The selection of a digitline $4$, a bitline $6$ and the direction of the current through the bitline $6$ is done by putting appropriate connecting switching elements, bitline selection switching elements and current direction switching elements in the ON-state. Means are provided for controlling the switching of the different switching elements. These means can be implemented in different ways by a skilled person on understanding the present invention. For example for controlling the connecting switching elements $32_i, 32_j$, regular row decoding circuits may be used, as known by a person skilled in the art. The row decoding circuitry, which can be designed by a person skilled in the art, selects e.g. row $R_i$ by bringing switch $32i$ in a connecting or closed state, and by bringing all other switches $32$ in a non-connecting or open state. A timing circuit may be provided to control the timing of each of the switches being closed or being open. The bitline selection switching elements $34, 36$ can be selected in parallel with the column selection. If column selection circuitry is controlled so as to select a column $C_k$, then this circuitry will enable bitline selection switching elements $34$ and $36$. Current direction switching elements $38$ and $40$ are selected depending on what needs to be written in the cell. The data which is applied on the inputs of the memory device will be a first or a second binary state, for example a "0" or a "1". Depending on this content, the appropriate current direction switching elements $38, 40$ are selected.

By re-routing the current generated to flow through a digitline in order for it to also flow through a bitline, only one current needs to be generated in order to program one bit in a memory element, the digitline current. Therefore a saving in current consumption is obtained when serially programming an MRAM memory.

Typically transistors will be used for the different switching elements, although the present invention is not limited thereto.

The digitline drivers $40_i, 40_j$ in combination with the connecting switching elements $32_i, 32_j$ can be implemented in different configurations.

A first embodiment of such a configuration is as would be used with the arrangement of FIG. 1: the digitline drivers $40_i, 40_j$ and the connecting switching elements $32_i, 32_j$ are separate elements. An implementation of a digitline driver $40_i$ is schematically shown in FIG. 4. It comprises two CMOS inverters $50, 51$ which are coupled in series. Each CMOS inverter $50, 51$ comprises an n-channel MOSFET $41, 43$ and a p-channel MOSFET 42, 44 connected in series between the ground 24 and a supply voltage Vdd. The gates of both the n-channel MOSFET 41 resp. 43 and the p-channel MOSFET 42 resp. 44 are connected together. The gates of the n-channel MOSFET 41 and the p-channel MOSFET 42 of the CMOS inverter 50 are connected to an input signal IN. The gates of the n-channel MOSFET 43 and the p-channel MOSFET 44 of the CMOS inverter 51 are connected to the output OUT1 of the CMOS inverter 50, which is formed by the connection between the n-channel MOSFET 41 and the p-channel MOSFET 42. The output OUT of the CMOS inverter 51, which is the point between the n-channel MOSFET 43 and the p-channel MOSFET 44 is connected to the digitline $4_i$ which the digitline driver $40_i$ has to drive.

If the input signal IN is high, p-channel MOSFET 42 is in the OFF-state and n-channel MOSFET 41 is in the ON-state. The output signal of the first CMOS inverter 50 is then low, and this low signal is the input of the second CMOS inverter 51. P-channel MOSFET 44 is in the ON-state, and n-channel MOSFET 43 is in the OFF-state. The output OUT of CMOS inverter 51, which is also the output of the digitline driver $40_i$, is then high. Inversely, if the input signal IN is low, also the output OUT of the digitline driver $40_i$ is also low.

Figure 5:
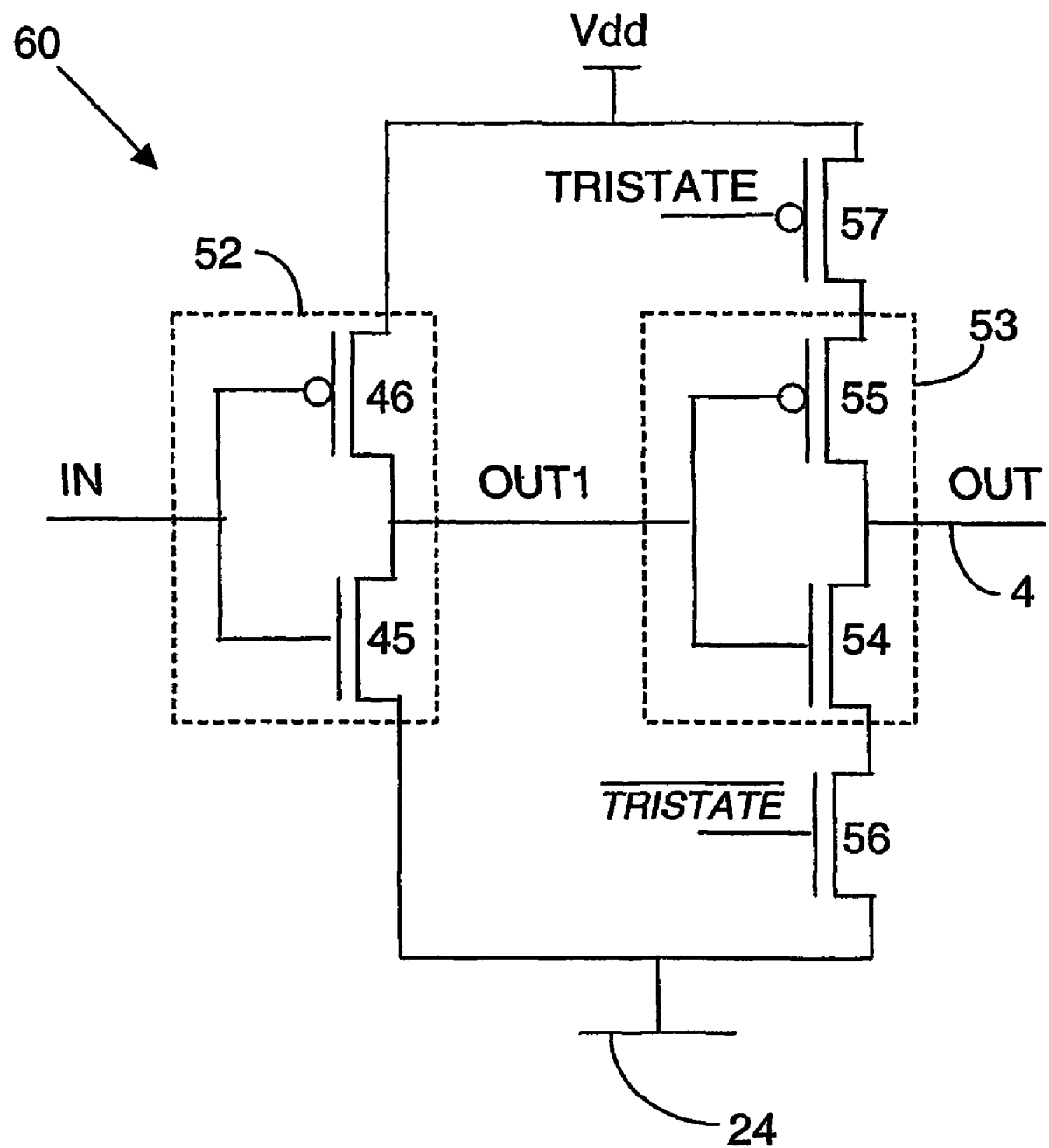
FIG. 5 is a circuit diagram of another embodiment of a digitline driver that may be used in the re-routing scheme of FIG. 3.

A second embodiment of a configuration of a digitline driver is represented in FIG. 5, in which a digitline driver 40 and the corresponding connecting switch 32 on the same digit line 4 are implemented as a tri-state driver 60. Deselection of a digitline 4 can be done by setting the tri-state driver 60 in the tri-state mode. The tri-state digitline driver 60 represented in FIG. 5 comprises a first CMOS inverter 52. The first CMOS inverter 52 comprises an n-channel MOSFET 45 and a p-channel MOSFET 46 connected in series between the ground 24 and a supply voltage Vdd. The gates of both the n-channel MOSFET 45 and the p-channel MOSFET 46 are connected together to an input signal IN. An output signal OUT1 of the first CMOS inverter 52 is obtained at the connection point between n-channel MOSFET 45 and p-channel MOSFET 46. The output signal OUT1 is the input signal for a second CMOS inverter 53. This second CMOS inverter 53 comprises an n-channel MOSFET 54 and a p-channel MOSFET 55 connected in series. The gates of both the n-channel MOSFET 54 and the p-channel MOSFET 55 are connected together to the output signal OUT1 of the first CMOS inverter 52. The drain of the n-channel MOSFET 54 is connected to the source of another n-channel MOSFET 56, the drain of which is connected to the ground 24. The source of the p-channel MOSFET 55 is connected to the drain of another p-channel MOSFET 57, the source of which is connected to the supply voltage Vdd. The gates of the n-channel MOSFET 56 and of the p-channel MOSFET 57 are connected to inversely biased tristate signals, i.e. if the signal to the gate of n-channel MOSFET 56 is high, the signal to the gate of p-channel MOSFET 57 is low and vice versa.

If the input signal IN is low, n-channel MOSFET 45 is in the OFF state and p-channel MOSFET 46 is in the ON-state. The output signal OUT1 of the first CMOS inverter 52 is high. N-channel MOSFET 54 is in the ON-state and p-channel MOSFET is in the OFF-state. If the signal TRISTATE, applied to the gate of p-channel MOSFET 57 is high, the signal $\overline{\text{TRISTATE}}$ applied to the gate of the n-channel MOSFET 56 is low, and both MOSFETs 56, 57 are in the OFF-state.

It will be appreciated that a person skilled in the art could provide other embodiments of arrangements for accomplishing the objectives of the re-routing of a digitline current through a selected bitline, embodying the present invention, on understanding the above description.

It is to be understood that although preferred embodiments and specific constructions and configurations have been discussed herein for devices according to the present invention, various changes or modifications in form and detail may be made without departing from the scope and spirit of this invention. For example, any kind of MRAM memory element may be used.

The invention claimed is:

1. A magnetoresistive memory unit comprising:
   a magnetoresistive memory element comprising a first magnetic layer and a second magnetic layer separated by a non-magnetic layer,
   a first conductive strip being magnetically coupled to the first magnetic layer and a second conductive strip being magnetically coupled to the second magnetic layer, the first and second conductive strips being arranged so as to cross each other at the magnetoresistive memory element,
   connecting means for temporarily electrically connecting the first conductive strip to the second conductive strip.

2. A memory unit according to claim 1, wherein the connecting means furthermore comprise current direction switching means for switching the direction of the current through the second conductive strip.

3. A memory unit according to claim 1, wherein the connecting means comprises at least one switch.

4. A memory unit according to claim 3, wherein the switch is formed by a transistor.

5. A memory unit according to claim 1, wherein the first conductive strip is provided with a line driver.

6. A memory unit according to claim 5, wherein the line driver is a tristatedriver.

7. A memory unit according to claim 1, wherein the magnetoresistive element comprises a magnetic tunnel junction.

8. A matrix with magnetoresistive memory units arranged in logically organized rows and columns, each memory unit including a magnetoresistive element, the matrix being provided with at least one first conductive strip and with at least one second conductive strip, all memory units on a row being magnetically coupled to one of the at least one first conductive strips and all memory units on a column being magnetically coupled to one of the at least one second conductive strips, wherein the matrix comprises connecting means for temporarily electrically connecting one of the at least one first conductive strips to one of the at least one second conductive strips.

9. A matrix according to claim 8, wherein the magnetoresistive elements comprise a magnetic tunnel junction.

10. A magnetoresistive memory arrangement comprising:
    an array of magnetoresistive memory cells arranged in rows and columns, each memory cell including
    a first magnetic layer,
    a second magnetic layer,
    a non-magnetic layer that separates the first and second magnetic layer,
    a plurality of row conductors, each row conductor being magnetically coupled to the first magnetic layer of each of a plurality of the memory cells in a common row;
    a plurality of column conductors, each column conductors being magnetically coupled to the second magnetic layer of each of a plurality of the memory cells in a common column; and
    for each row conductor and column conductor that are respectively magnetically coupled to first and second magnetic layers of a common memory cell, a row-column connector to selectively electrically connect said row conductor and column conductor to apply magnetic fields having different directions to the common memory cell.

11. The memory arrangement of claim 10, wherein each row-column connector includes a current direction switch to switch the direction of the current through the column conductor.

12. The memory arrangement of claim 10, further including a line driver for each of the plurality of row conductors.

13. The memory arrangement of claim 10, further including a tri-state line driver for each of the plurality of row conductors.

14. The memory element of claim 10, wherein the memory cells form bits of an MRAM arrangement, and wherein the row and column conductors apply magnetic fields to serially program bits of the MRAM arrangement.

15. The memory element of claim 10, wherein the row and column conductors at each memory cell are arranged, relative to the memory cell, to apply magnetic fields having different directions to the common memory cell by routing current past the memory cell in respectively different directions.

* * * * *